United States Patent [19]

Perry

[11] Patent Number: 5,012,389

[45] Date of Patent: Apr. 30, 1991

[54] BOARD WIRING PATTERN FOR A HIGH DENSITY MEMORY MODULE

[75] Inventor: Richard A. Perry, Charlotte, N.C.

[73] Assignee: Hand Held Products, Inc., Charlotte, N.C.

[21] Appl. No.: 284,238

[22] Filed: Dec. 14, 1988

[51] Int. Cl.⁵ ............................................... H05K 7/02
[52] U.S. Cl. .................................................... 361/409
[58] Field of Search ............... 361/398, 399, 406, 409, 361/410, 416; 307/89; 174/250, 253, 254, 255, 261; 324/174, 173, 719; 73/766, 708; 364/900, 922.7; 357/68, 74, 75, 45; 333/161

[56] References Cited

U.S. PATENT DOCUMENTS

| | | | |
|---|---|---|---|
| 4,674,812 | 6/1987 | Thom et al. | 439/78 |
| 4,689,441 | 8/1987 | Dick et al. | 174/250 |
| 4,733,461 | 3/1988 | Nakano | 29/830 |
| 4,734,980 | 4/1988 | Nakamura et al. | 29/850 |
| 4,750,076 | 6/1988 | Kammiller | 361/15 |

OTHER PUBLICATIONS

Mitsubishi Circuit Board P4–60AC-AC-B (Photograph Front & Back-Side).
Mitsubishi VLSI MOS Memory RAM ROM New Package, Jan. 1988.
Mitsubishi LSIs M5M5256VP, RV-10L, -12L, -10LL, -12LL, Jan. 1988.
Mitsubishi Circuit Board P4–60AC-AC-B (Photograph, Front and Back Sides).

Primary Examiner—Leo P. Picard
Assistant Examiner—Donald A. Sparks
Attorney, Agent, or Firm—Bell, Seltzer, Park & Gibson

[57] ABSTRACT

A high density memory module in which memory chips are mounted in an array of rows and columns on a printed circuit board. The circuit board includes groups of serpentine parallel conductors which extend along adjacent columns for connecting corresponding power, ground, control, address and data pins between the adjacent columns to one another. Adjacent groups of serpentine parallel conductors are nested within one another. According to the invention, high density packaging is provided for large chip arrays, using a minimum number to vias to interior board layers, and minimum interchip spacing.

34 Claims, 5 Drawing Sheets

BOARD WIRING PATTERN FOR A HIGH DENSITY MEMORY MODULE

FIELD OF THE INVENTION

This invention relates to the packaging of electronic components and more specifically to a board wiring pattern which permits high density packaging of integrated circuit memory chips into a high density memory module.

BACKGROUND OF THE INVENTION

Recent advances in solid state technology have produced low cost high density memory chips. For example, a Static Random Access Memory (SRAM) marketed by Mitsubishi Electric Company as part number M5M5256 is capable of storing 256,000 bits in a Very Small Outline Package (VSOP) chip having a 28 pin surface mount design with a molded body only 0.465"×0.315" and a lead spacing of only 0.0217" between centers. In order to fully benefit from these high density memory chips, high density packaging of the chips on a mounting surface, for example a printed circuit board, must also be provided. In fact, as chip integration becomes more and more dense, the packaging for the chips has become the limiting factor on the ultimate density of the memory module. This is particularly the case with memory chips in which many parallel circuit board connections for power, ground, control, address and data signals are required.

Present day high density packaging techniques typically employ multilayer printed circuit boards having complicated wiring patterns on the outer surfaces thereof and two or more interior layers for bringing signals to the outer surfaces using vias or plated through holes. As the physical dimensions of the chips decrease and the memory density increases, it has become more difficult to connect these chips together in an efficient manner. For example, when the pin spacing is 0.0217" as in the above mentioned Mitsubishi chip, there is no room to run surface wires between the pins for memory interconnection. Rather than running wires between pins, vias leading to intermediate layers must be used. Unfortunately, vias require large board area for drilling and plating, and may create reliability problems. As the chip density increases, the large number of vias limits the overall chip packaging density.

These problems are illustrated by a prior art memory module incorporating an array of the above-mentioned Mitsubishi 256K VSOP SRAM chips. FIG. 1 illustrates the pin configuration for the Mitsubishi 256K VSOP SRAM. To simplify packaging, the SRAM is produced in a "normal lead" and "reverse lead" configuration. In the "normal lead" configuration, the pins are numbered around the package in a counterclockwise manner, starting just to the left of the center line on one of the narrow sides. In a "reverse lead" configuration, the same molded part is used, however the package is turned over when put into the lead forming press. The leads are therefore numbered clockwise, starting to the right of the center line on one narrow side. An indicator (for example a large or small dot) on the chip body distinguishes between normal and reverse lead chips.

FIG. 2 illustrates a prior art technique for connecting a normal and reverse chip of FIG. 1. Due to the mirror image pin configuration of the normal and reverse chips, like pins may be connected together by a plurality of parallel concentric conductors. A separate connection is required only for the "Chip Select" (/CS) pins to permit individual chip selection.

The wiring pattern of FIG. 2 simplifies the connection between two chips, but it has a number of shortcomings for connecting arrays of chips. While this pattern is expandable in the horizontal direction to accommodate additional columns of chips, it cannot readily accommodate more than two rows of chips. The pattern of FIG. 2 may only be expanded in the vertical direction to accommodate three or more rows by providing a via for each conductor to route the wiring to other rows through interior layers. These vias, which are required for three or more rows, severely limit chip packing density. Moreover, even in a two-row array, the large number of concentric conductors under the chips requires very thin conductors to avoid short circuits between adjacent conductors. These thin conductors are difficult to make and may cause reliability problems.

SUMMARY OF THE INVENTION

It is therefore an object of the invention to provide a circuit board wiring pattern for a high density memory module.

It is another object of the invention to provide a circuit board wiring pattern which is expandable to large size chip arrays having many rows and columns.

It is yet another object of the invention to provide a circuit board wiring pattern which minimizes the number of vias necessary for chip interconnection.

It is still another object of the invention to provide a circuit board wiring pattern which accommodates three or more rows of chips using primarily surface connections.

These and other objects are provided by a high density memory module in which the chips are mounted in an array of rows and columns and the mounting surface includes groups of serpentine parallel conductors extending along adjacent columns in the array, for connecting corresponding signal pins (that is power, ground, control, address and data pins) between the adjacent columns to one another. The serpentine patterns of conductors extend under the chips which are connected thereby, with a single pattern connecting all of the chips in adjacent columns. When alternating normal and reverse pin chips are used in the array, vias are only required at the top or bottom of the array.

More particularly, according to the invention, the serpentine pattern of parallel conductors connects the corresponding signal pins on the left side of a first chip to the right side of a second chip in the same row and previous column as the first chip, to the right side of a third chip in the next row and same column as the second chip, to the left side of a fourth chip in the same row and next column as the third chip, to the left side of a fifth chip in the same column and next row as the fourth chip, and to the right side of a sixth chip in the same row and previous column of the fifth chip.

Viewed from the perspective of one chip in the array, a pattern of concentric conductors connects the signal pins on the left side of a first chip with the corresponding signal pins on the left side of the chip below the first chip (that is, in the same column, next row), while a second pattern of concentric conductors connects the signal pins on the right side of the first chip with the corresponding signal pins on the right side of the chip above the first chip (that is, in the same column, previous row).

In a preferred embodiment, the adjacent serpentine conductor patterns may be nested within one another to provide extremely dense packaging without requiring very thin conductors. High density packaging may thus be provided for large chip arrays using a minimum number of vias and minimum interchip spacing. According to the invention, a density of 0.35 cubic inches per megabyte of memory may be obtained, using the above mentioned 256K SRAM VSOP chips.

DETAILED DESCRIPTION OF THE INVENTION

The present invention now will be described more fully hereinafter with reference to the accompanying drawings, in which a preferred embodiment of the invention is shown. This invention may, however, be embodied in many different forms and should not be construed as limited to the embodiment set forth herein; rather, applicants provide this embodiment so that this disclosure will be thorough and complete, and will fully convey the scope of the invention to those skilled in the art.

Figure 1:
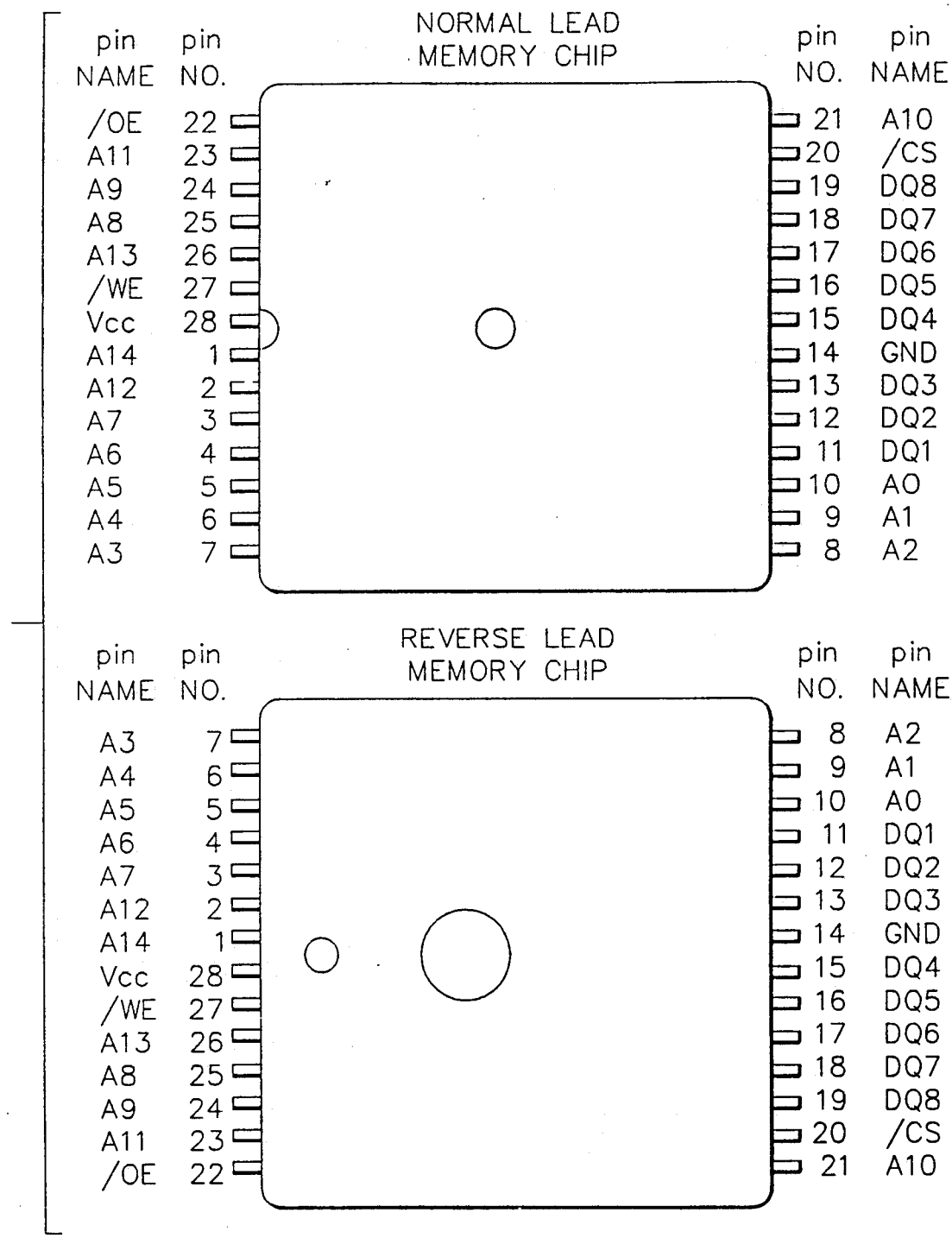
FIG. 1 illustrates a prior art configuration for normal and reverse lead 256K SRAM VSOP chips.
Figure 2:
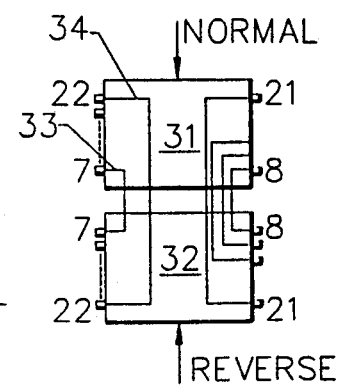
FIG. 2 illustrates a prior art wiring pattern for connecting the chips of FIG. 1.

Referring now to FIG. 1, the prior art normal and reverse lead SRAM chips, for example the Mitsubishi M5M5256 256K SRAM VSOP chips, are illustrated. It will be seen that the chip employs a number of signal pins for supplying address signals (labeled A0-A14), data signals (labeled DQ1-DQ8), control signals (labelled 0E and WE), power (labeled VCC), and ground (labeled GND), which may be connected to all chips in a memory array. Each chip also includes an enable or chip select pin (labeled /CS) for selecting an individual chip in an array, which must be separately connected for each chip. FIG. 2 illustrates a prior art wiring pattern for connecting a normal and reverse pin chip (31 and 32 respectively) using two groups of parallel concentric conductors under the chips which connect like pins on each side. For example, on the left side, pins 7 and 22 are shown connected by two concentric conductors 33 and 34 respectively. As was described above, this configuration cannot be extended to more than two rows of chips without using many vias. The configuration also requires very fine conductors because of the large number of conductors under the chips.

Figure 3:
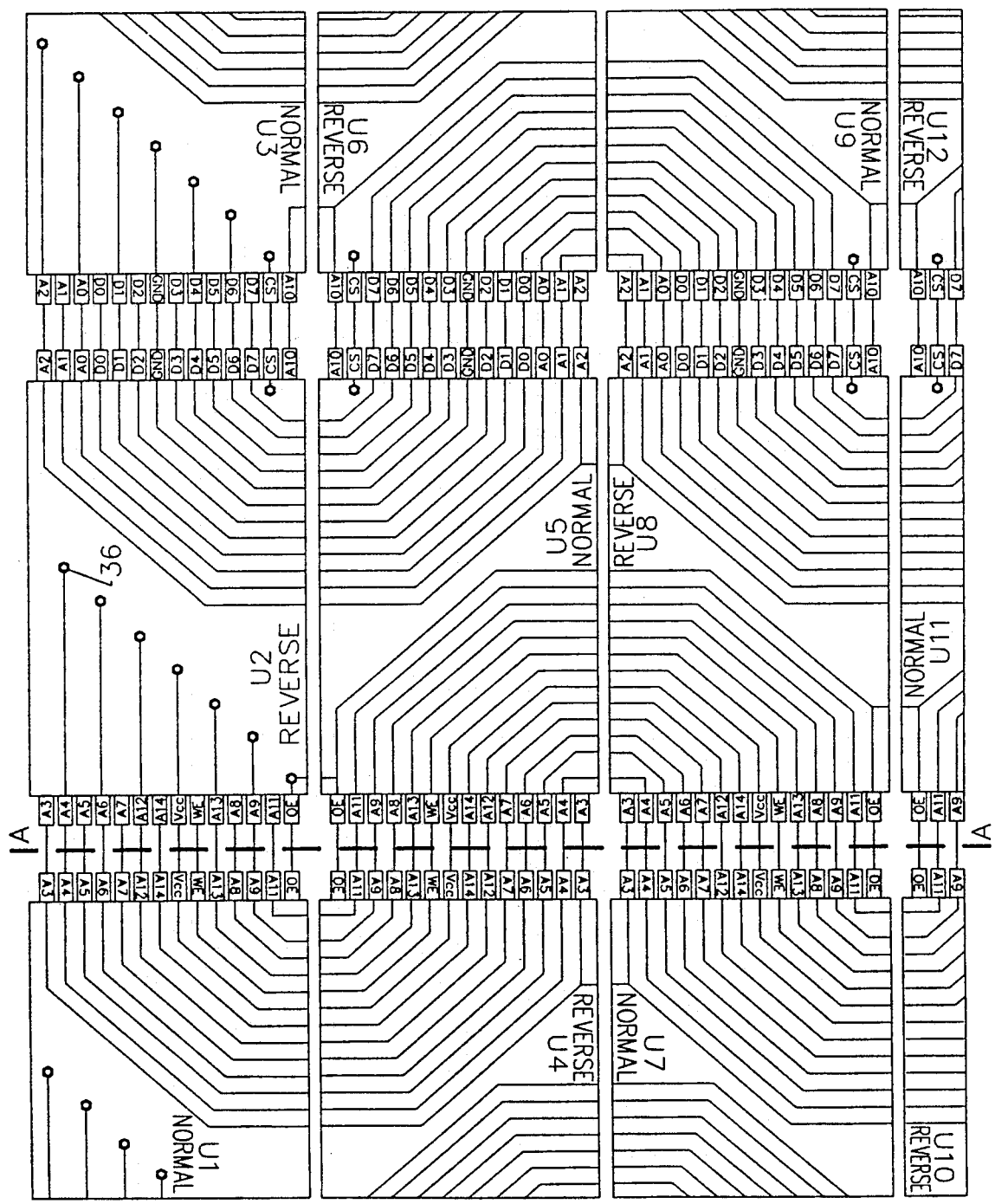
FIG. 3 is a schematic diagram of a preferred embodiment of a circuit board wiring pattern according to the invention.

Referring now to FIG. 3, a schematic diagram of a preferred embodiment of a circuit board wiring pattern according to the invention is illustrated. As may be seen from FIG. 3, each column of the array comprises alternating normal and reverse chips and each row comprises alternating normal and reverse pin chips in alternating 180° rotations. In FIG. 3, an array of four rows and three columns is illustrated with the rows extending in the horizontal direction and columns extending in the vertical direction. For example, row 2 comprises chips U4, U5 and U6, while column 1 comprises chips U1, U4, U7 and U10.

According to the invention, a serpentine pattern of nested conductors extends along the line defined by adjacent columns. Thus for example, a first serpentine pattern extends along columns 1 and 2 on both sides of line A—A. Referring to pin A4 of chip U2, it will be seen that the serpentine pattern connects this pin with pin A4 of chip U1, pin A4 of chip U4, pin A4 of chip U5, pin A4 of chip U8, pin A4 of chip U7, and continues along this pattern to connect corresponding pins between adjacent columns to one another. It will also be seen that a single via 36 connects pin A4 of chip U2 to a driver chip outside the array. According to the preferred embodiment of the invention, only one via is necessary for each signal pin of the chip. These vias may be placed at the top or bottom of the array or in alternating top and bottom positions where the pattern terminates.

Referring now to chip U5 of FIG. 3, the nesting of patterns will now be described. It will be seen that the pins on the left side of chip U5 are connected to like pins on the left side of chip U8 which lies in the same column but next row as chip U5, that is below chip U5. The pins on the right side of chip U5 are connected to like pins at the right side of chip U2 which lies in the same column and previous row of chip U5, that is above chip U5. By connecting the pins on one side of the chip to the chip below and on the other side of the chip to the chip above, a nesting of the serpentine patterns is permitted, thereby allowing wider conductor spacing. It will be understood by those having skill in the art that the "left" and "right" designations are arbitrary and may be reversed. In the generic sense, connections between "one" side and the "opposite" side of the chips are made.

Still referring to FIG. 3, it will be seen that intermediate vias are necessary to individually connect the chip select (/CS) of each chip to an appropriate address circuit outside the array. This is the only individual chip connection that is required.

Figure 4:
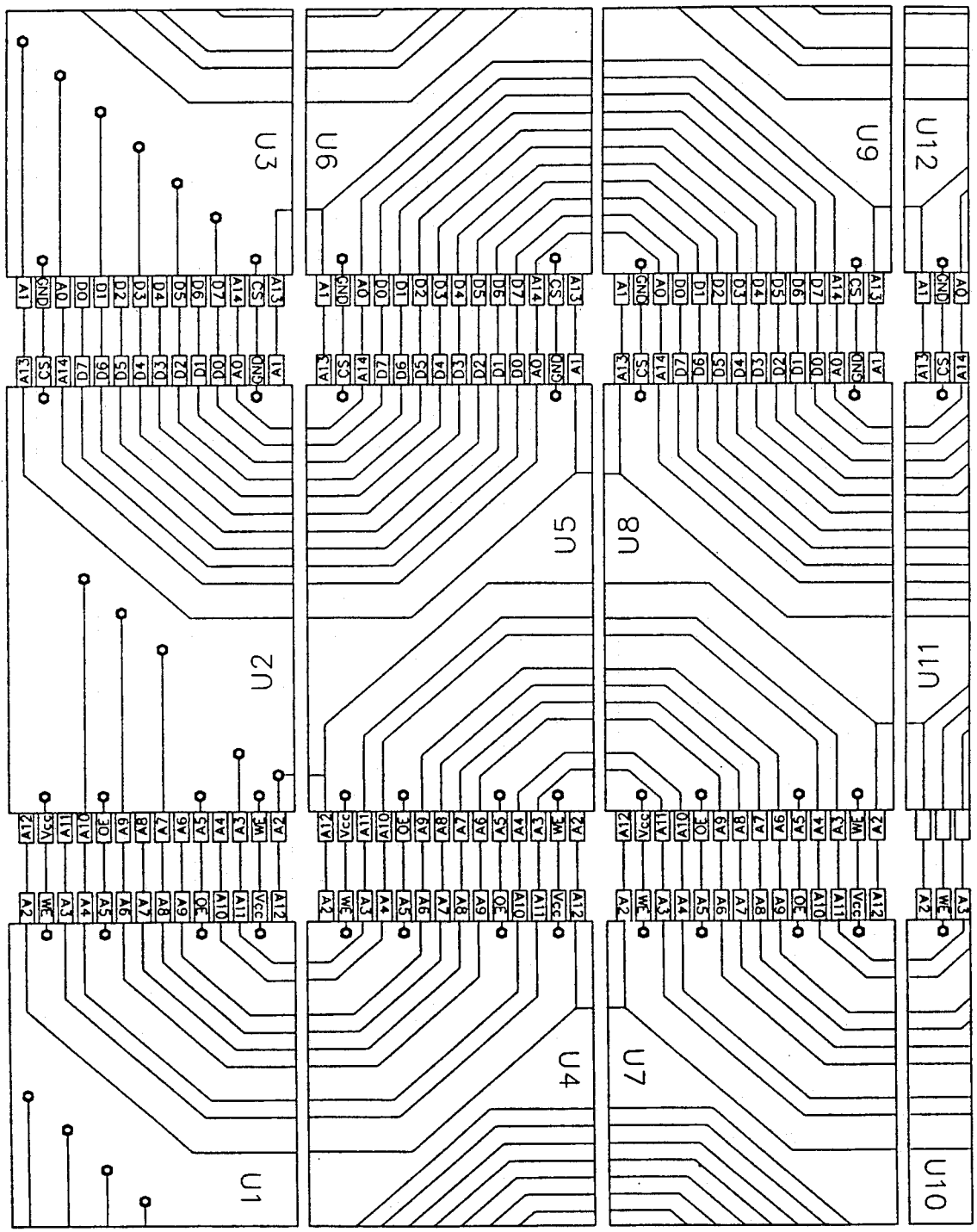
FIG. 4 is a schematic diagram of a first alternate embodiment of a wiring pattern according to the invention.
Figure 5:
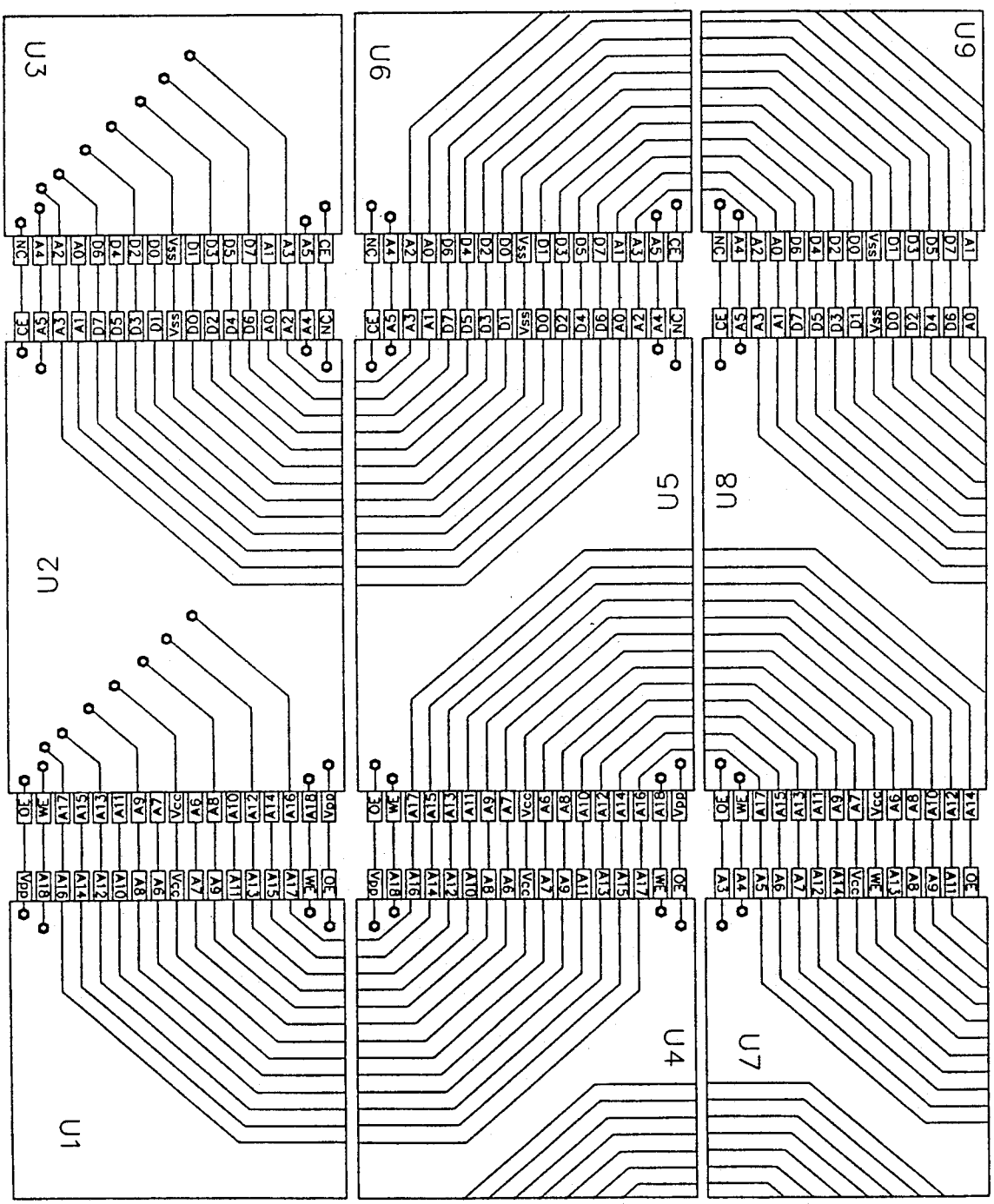
FIG. 5 is a schematic diagram of a second alternate embodiment of a wiring pattern according to the invention.

In the preferred embodiment of the invention illustrated in FIG. 3, normal and reverse pin chips are employed to minimize the vias according to the present invention. FIGS. 4 and 5 will illustrate the wiring pattern of the present invention using only one type of chip (that is either all normal or all reverse types). The invention may be advantageously employed with only one type of chip; however the number of vias may increase.

Referring now to FIG. 4, all of the chips shown are a normal configuration. The symmetry of FIG. 3 therefore does not exist so that a separate via is necessary for the VCC, DE, A5, WE, and GND pins of chip U5. Nonetheless, according to the present invention, it will be seen that only six vias are needed for interior chips in the array (for example chips U5 or U8). An improvement over the prior art technique (FIG. 2) in which every pin requires a separate via is provided.

Referring again to FIG. 4, it will be seen that address and data pins may be connected in the serpentine pattern even though identical address/data pins are not connected to one another by a single conductor. For example, referring to FIG. 4, pin A3 of chip U2 is connected to pin A11 of U1, which is connected to pin A3 of U4, pin A11 of U5, and pin A3 of U8. Although the same numbered address pins are not connected, the address pins which are connected (A3 and A11) will function as a single address pin for the memory array. Thus, the symmetrical pin arrangement of FIG. 4 permits address pins to be connected to address pins and data pins to be connected to data pins using the serpentine pattern of the invention.

Referring now to FIG. 5, an array of all normal chips having a symmetrical pin configuration and an odd number of pins per chip side is shown. When the chips have an odd number of pins per side (here 17), and when the pins are arranged symmetrically with respect to the center pin (here VCC and VSS), only two vias at each corner of each interior chip must be used. As was described above with respect to FIG. 4, identical address-/data pins need not be connected in the serpentine pattern.

Figure 6A:
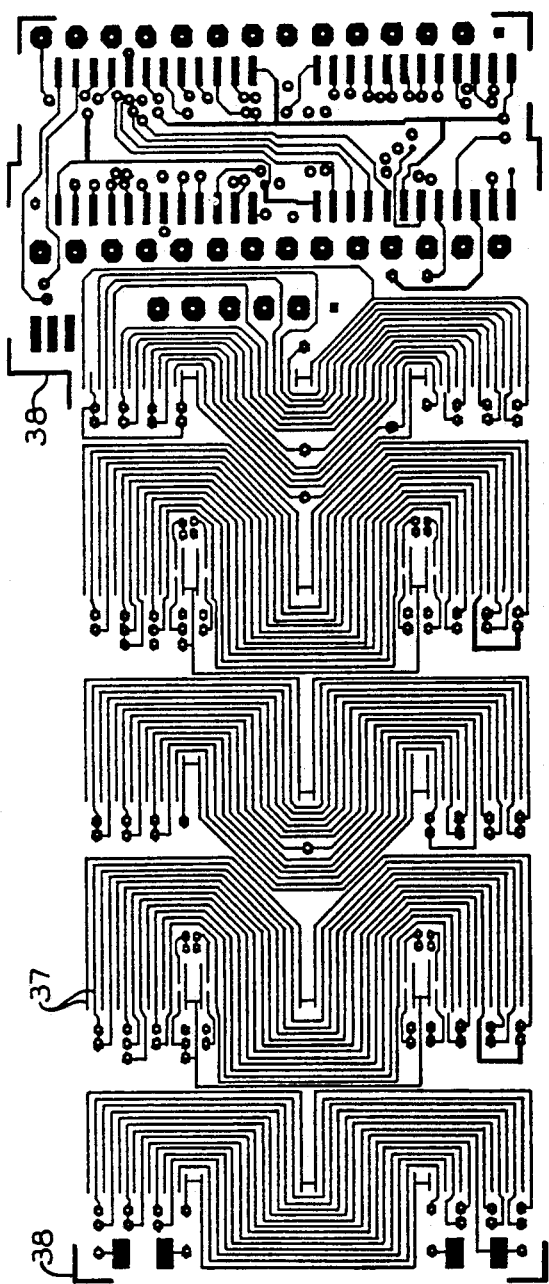
FIGS. 6A and 6B illustrate an actual board wiring layout according to the preferred embodiment of FIG. 3.
Figure 6B:
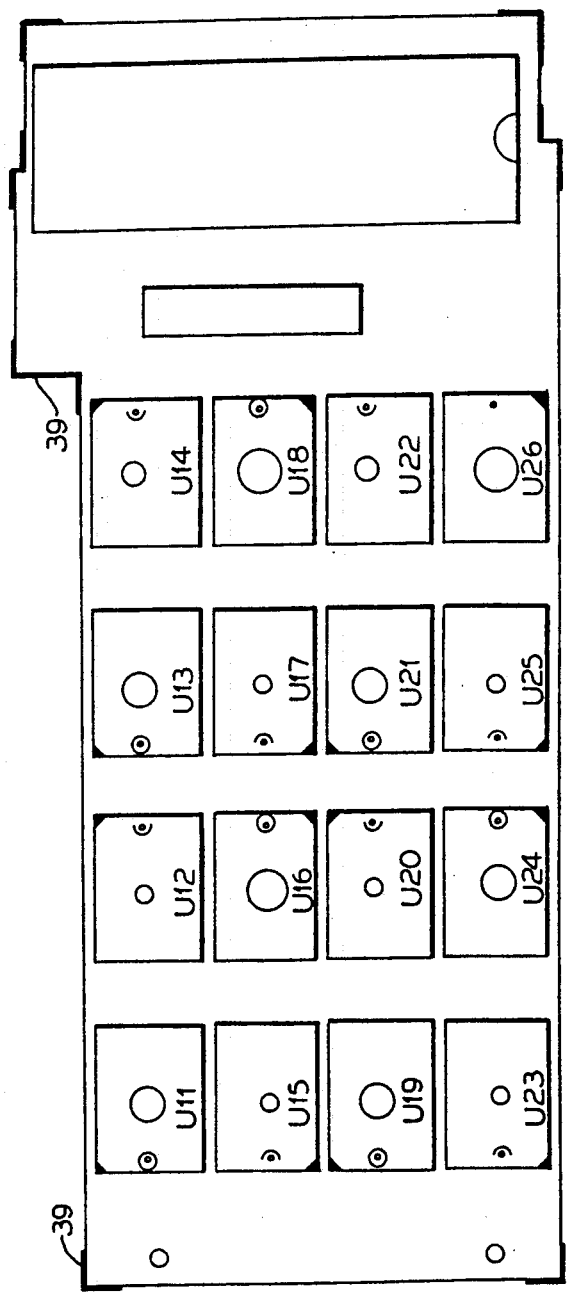

Referring now to FIG. 6, an actual board layout for a 4×4 array of normal and reverse chips of FIG. 3 is shown. FIG. 6A illustrates the actual layout of the top layer of the printed circuit board, while FIG. 6B illustrates the chip sites which correspond to the wiring. By superimposing FIG. 6B on FIG. 6A and aligning reference marks 38 to reference marks 39, the correspondence between the wiring patterns and chip sites may be seen. Each chip site includes pads, for example 37, for connecting the board wiring to the appropriate chip pins. Control circuitry is illustrated to the right of the rightmost array column of FIGS. 6A and 6B and does not form a part of the present invention. It will be understood that this array may be expanded in the vertical direction without increasing the number of vias required.

In the drawings and specification, there have been disclosed typical preferred embodiments of the invention and, although specific terms are employed, they are used in a generic and descriptive sense only and not for purposes of limitation, the scope of the invention being set forth in the following claims.

That which I claim is:

1. A memory module comprising:
a plurality of memory chips and a mounting surface therefor, each chip including a plurality of signal pins for power, ground, control, address and data signals and at least one enable pin for selecting said chip, said memory chips being mounted on said mounting surface in an array of at least three rows and a plurality of columns;
said mounting surface including a group of serpentine parallel conductors extending along two adjacent columns in the at least three rows of said array, which connect the corresponding signal pins between the two adjacent columns in the at least three rows to one another.

2. A memory module comprising:
a plurality of memory chips and a mounting surface therefor, each chip including a plurality of signal pins for power, ground, control, address and data signals and at least one enable pin for selecting said chip, said memory chips being mounted on said mounting surface in an array of rows and columns;
said mounting surface including a group of serpentine parallel conductors extending along two adjacent columns in said array, which connect the corresponding signal pins between the two adjacent columns to one another;
wherein said memory chips are packaged in normal and reverse pin configurations, the normal pin configuration comprising said plurality of signal pins and said at least one enable pin in a counter-clockwise arrangement, and the reverse pin configuration comprising said plurality of signal pins and said at least one enable pin in a clockwise arrangement; and wherein said columns of said array comprise alternating normal and reverse pin chips, and said at least three rows of said array comprise alternating normal and reverse pin chips in alternating 180° rotations.

3. The memory module of claim 1 wherein said mounting surface includes a plurality of groups of serpentine parallel conductors, with a respective group extending along respective adjacent columns in the at least three rows of said array, which connect the corresponding signal pins between each of said respective adjacent columns in the at least three rows to one another, with the serpentine patterns along said respective adjacent columns being nested within one another.

4. The memory module of claim 1 wherein said mounting surface is a printed circuit board.

5. A memory module comprising:
a plurality of memory chips and a mounting surface therefor, each chip including a plurality of signal pins for power, ground, control, address and data signals and at least one enable pin for selecting said chip, said memory chips being mounted on said mounting surface in an array of rows and columns;
said mounting surface including a first pattern of concentric conductors which connect the signal pins on one end of a first chip with corresponding signal pins on said one end of the chip below said first chip; and a second pattern of concentric conductors which connect the signal pins on the opposite end of said first chip with the corresponding signal pins on the opposite end of the chip above said first chip; said first pattern lying under said first chip and said chip below said first chip, and said second pattern lying under said first chip and said chip above said first chip.

6. The memory module of claim 5 wherein said one end is the left end and wherein said opposite end is the right end of the respective ones of said chips.

7. A memory module comprising:
a plurality of memory chips and a mounting surface therefor, each chip including a plurality of signal pins for power, ground, control, address and data signals and at least one enable pin for selecting said chip, said memory chips being mounted on said mounting surface in an array of rows and columns;
said mounting surface including a first pattern of concentric conductors which connect the signal pins on one end of a first chip with corresponding signal pins on said one end of the chip below said first chip; and a second pattern of concentric conductors which connect the signal pins on the opposite end of said first chip with the corresponding signal pins on the opposite end of the chip above said first chip; said first pattern lying under said first chip and said chip below said first chip, and said second pattern lying under said first chip and said chip above said first chip;
wherein said memory chips are packaged in normal and reverse pin configurations, the normal pin configuration comprising said plurality of signal pins and said at least one enable pin in a counterclockwise arrangement, and the reverse pin configuration comprising said plurality of signal pins and said at least one enable pin in a clockwise arrangement; and wherein said columns of said array comprise alternating normal and reverse pin chips, and said rows of said array comprise alternating normal and reverse pin chips in alternating 180° rotations.

8. The memory module of claim 5 wherein said mounting surface is a printed circuit board.

9. A memory module comprising:
a plurality of memory chips and a mounting surface therefor, each chip including a plurality of signal pins for power, ground, control, address and data signals and at least one enable pin for selecting said chip, said memory chips being mounted on said mounting surface in an array of rows and columns;
said mounting surface including a first serpentine pattern of parallel conductors which connect corresponding ones of said signal pins on one end of a first chip to the opposite end of a second chip in the same row and previous column as said first chip, to the opposite end of a third chip in the next row and same column as said second chip, to the one end of a fourth chip in the same row and next column as said third chip, to the one end of a fifth chip in the same column and next row as said fourth chip, and to the opposite end of a sixth chip in the same row and previous column as said fifth chip.

10. The memory module of claim 9 wherein said one end is the left end and wherein said opposite end is the right end of the respective ones of said chips.

11. The memory module of claim 9 wherein said memory chips are packaged in normal and reverse pin configurations, the normal pin configuration comprising said plurality of signal pins and said at least one enable pin in a counterclockwise arrangement, and the reverse pin configuration comprising said plurality of signal pins and said at least one enable pin in a clockwise arrangement; and wherein said columns of said array comprise alternating normal and reverse pin chips and said rows of said array comprise alternating normal and reverse pin chips in alternating 180° rotations.

12. The memory module of claim 9 wherein said mounting surface includes a second serpentine pattern of parallel conductors which connect corresponding ones of said signal pins on the opposite end of said first chip to the one end of a seventh chip in the same row and next column as said first chip to the opposite end of said fourth chip, to the one end of an eighth chip in the same row and next column as said fourth chip, to the one end of a ninth chip in the same column and next row as said eighth chip, and to the opposite end of said fifth chip.

13. The memory module of claim 12 wherein said one end is the left end and wherein said opposite end is the right end of the respective ones of said chips.

14. The memory module of claim 12 wherein said first and second serpentine patterns are nested within one another.

15. The memory module of claim 9 wherein said mounting surface is a printed circuit board.

16. A memory module comprising:
a plurality of memory chips and a mounting surface therefor, each chip including a plurality of signal pins for power, ground, control, address and data signals and at least one enable pin for selecting said chip, said memory chips being mounted on said mounting surface in an array of rows and columns;
said mounting surface including a plurality of parallel conductors connecting the signal pins at one end of each chip with corresponding ones of the signal pins at the adjacent end of the chip in the previous column and the same row; and connecting the signal pins at the other end of each chip with the corresponding ones of the signal pins at the adjacent end of the chip in the next column and the same row;
said mounting surface further including a first pattern of concentric conductors connecting the signal pins at said one end of each chip with corresponding ones of the signal pins at said one end of the chip in the next row of the same column, said first pattern of concentric conductors lying under the two chips which are connected thereby; and a second pattern of concentric conductors connecting the signal pins at said other end of each chip with corresponding ones of the signal pins said one end of the chip in the previous row of the same column, said second pattern of concentric conductors lying under the two chips which are connected thereby.

17. The memory module of claim 16 wherein said memory chips are packaged in normal and reverse pin configurations, the normal pin configuration comprising said plurality of signal pins and said at least one enable pin in a counterclockwise arrangement, and the reverse pin configuration comprising said plurality of signal pins and said at least one enable pin in a clockwise arrangement; and wherein said columns of said array comprise alternating normal and reverse pin chips, and said rows of said array comprise alternating normal and reverse pin chips in alternating 180° rotations.

18. The memory module of claim 16 wherein said first and second patterns are nested within one another.

19. The memory module of claim 16 wherein said mounting surface is a printed circuit board.

20. A mounting surface for memory chips comprising:
a plurality of chip sites, each including a plurality of signal pads for power, ground, control, address and data signals and at least one enable pad, said memory chip sites being arranged on said mounting surface in an array of at least three rows and a plurality of columns; and
a group of serpentine parallel conductors extending along two adjacent columns in the at least three rows of said array, which connect the corresponding signal pads between the two adjacent columns in the at least three rows to one another.

21. The mounting surface of claim 20 wherein said mounting surface includes a plurality of groups of serpentine parallel conductors, with a respective group extending along respective adjacent columns in the at least three rows of said array, which connect the corresponding signal pads between each of said respective adjacent columns in the at least three rows to one another, with the serpentine patterns along said respective columns being nested within one another.

22. The mounting surface of claim 20 wherein said mounting surface is a printed circuit board.

23. A mounting surface for memory chips comprising:
a plurality of chip sites, each including a plurality of signal pads for power, ground, control, address and data signals and at least one enable pad, said memory chip sites being arranged on said mounting surface in an array of rows and columns; and a first pattern of concentric conductors which connect the signal pads on one end of a first chip site with corresponding signal pads on said one end of the chip site below said first chip site; and a second pattern of concentric conductors which connect the signal pads on the opposite end of said first chip site with the corresponding signal pads on the opposite end of the chip site above said first chip site; said first pattern lying on said first chip site and said chip site below said first chip site, and said second pattern lying on said first chip site and said chip site above said first chip site.

24. The mounting surface of claim 23 wherein said mounting surface is a printed circuit board.

25. The mounting surface of claim 23 wherein said one end is the left end and said opposite end is the right end of the respective ones of said chip sites.

26. A mounting surface for memory chips comprising:

a plurality of chip sites, each including a plurality of signal pads for power, ground, control, address and data signals and at least one enable pad, said memory chip sites being arranged on said mounting surface in an array of rows and columns; and a first serpentine pattern of parallel conductors which connect corresponding ones of said signal pads on one end of a first chip site to the opposite end of a second chip site in the same row and previous column as said first chip site, to the opposite end of a third chip site in the next row and same column as said second chip site, to the one end of a fourth chip site in the same row and next column as said third chip site, to the one end of a fifth chip site in the same column and next row as said fourth chip site, and to the opposite end of a sixth chip site in the same row and previous column as said fifth chip site.

27. The mounting surface of claim 26 wherein said one end is the left end and said opposite end is the right end of the respective ones of said chip sites.

28. A mounting surface for memory chips comprising:

a plurality of chip sites, each including a plurality of signal pads for power, ground, control, address and data signals and at least one enable pad, said memory chip sites being arranged on said mounting surface in an array of rows and columns;

a first serpentine pattern of parallel conductors which connect corresponding ones of said signal pads on one end of a first chip site to the opposite end of a second chip site in the same row and previous column as said first chip site, to the opposite end of a third chip site in the next row and same column as said second chip site, to the one end of a fourth chip site in the same row and next column as said third chip site, to the one end of a fifth chip site in the same column and next row as said fourth chip site, and to the opposite end of a sixth chip site in the same row and previous column as said fifth chip site; and a second serpentine pattern of parallel conductors which connect corresponding ones of said signal pads on the opposite end of said first chip site to one end of a seventh chip site in the same row and next column as said first chip site, to the opposite end of said fourth chip site to the one end of an eighth chip site in the same row and next column as said fourth chip site, to the one end of a ninth chip site in the same column and next row as said eighth chip site, and to the opposite end of said fifth chip site.

29. The mounting surface of claim 28 wherein said one end is the left end and said opposite end is the right end of the respective ones of said chip sites.

30. The mounting surface of claim 28 wherein said first and second serpentine patterns are nested within one another.

31. The mounting surface of claim 26 wherein said mounting surface is a printed circuit board.

32. A mounting surface for memory chips comprising:

a plurality of chip sites each including a plurality of signal pads for power, ground, control, address and data signals and at least one enable pad, said chip sites being arranged on said mounting surface in an array of rows and columns;

a plurality of parallel conductors connecting the signal pads at one end of each chip site with corresponding ones of the signal pads at the adjacent end of the chip site in the previous column and the same row; and connecting the signal pads at the other end of each chip site with the corresponding ones of the signal pads at the adjacent end of the chip site in the next column and the same row; and a first pattern of concentric conductors connecting the signal pads at said one end of each chip site with corresponding ones of the signal pads at said one end of the chip site in the next row of the same column, said first pattern of concentric conductors lying on the two chip sites which are connected thereby; and a second pattern of concentric conductors connecting the signal pads at said other end of each chip site with corresponding ones of the signal pads said one end of the chip site in the previous row of the same column, said second pattern of concentric conductors lying on the two chip sites which are connected thereby.

33. The mounting surface of claim 32 wherein said first and second patterns are nested within one another.

34. The mounting surface of claim 32 wherein said mounting surface is a printed circuit board.

* * * * *

UNITED STATES PATENT AND TRADEMARK OFFICE
CERTIFICATE OF CORRECTION

PATENT NO. : 5,012,389
DATED : April 30, 1991
INVENTOR(S) : Perry

It is certified that error appears in the above-identified patent and that said Letters Patent is hereby corrected as shown below:

In the Abstract, line 11, "number to vias" should be --number of vias--

Column 3, line 49, "belled OE and WE)," should be --belled/OE and/WE),--

Signed and Sealed this

Sixteenth Day of February, 1993

Attest:

STEPHEN G. KUNIN

Attesting Officer

Acting Commissioner of Patents and Trademarks